United States Patent
Boutillon et al.

(10) Patent No.: US 10,432,224 B2
(45) Date of Patent: Oct. 1, 2019

(54) METHODS AND DEVICES FOR GENERATING OPTIMIZED CODED MODULATIONS

(71) Applicant: UNIVERSITE DE BRETAGNE SUD, Lorient (FR)

(72) Inventors: Emmanuel Boutillon, Lorient (FR); Ahmed Abdmouleh, Brest (FR)

(73) Assignee: UNIVERSITE DE BRETAGNE SUD, Lorient (FR)

( * ) Notice: Subject to any disclaimer, the term of this patent is extended or adjusted under 35 U.S.C. 154(b) by 61 days.

(21) Appl. No.: 15/691,939

(22) Filed: Aug. 31, 2017

(65) Prior Publication Data

US 2018/0069570 A1 Mar. 8, 2018

(30) Foreign Application Priority Data

Sep. 2, 2016 (EP) ..................... 16306110

(51) Int. Cl.
*H03M 13/11* (2006.01)
*H03M 13/00* (2006.01)
(Continued)

(52) U.S. Cl.
CPC ..... *H03M 13/1171* (2013.01); *H03M 13/255* (2013.01); *H03M 13/353* (2013.01);
(Continued)

(58) Field of Classification Search
CPC .......... H03M 13/1171; H03M 13/116; H03M 13/255; H03M 13/353; H03M 13/616; H04L 1/0041; H04L 1/0045
See application file for complete search history.

(56) References Cited

U.S. PATENT DOCUMENTS

2002/0051501 A1* 5/2002 Demjanenko ......... H04L 1/0013
375/298
2005/0015704 A1* 1/2005 Piret ................... H03M 13/132
714/781
(Continued)

OTHER PUBLICATIONS

European Search Report for 16306110.4 dated Mar. 8, 2017.
(Continued)

*Primary Examiner* — April Y Blair
*Assistant Examiner* — Sazzad Hossain
(74) *Attorney, Agent, or Firm* — Meagher Emanuel Laks Goldberg & Liao, LLP (57) ABSTRACT

At least a method and an apparatus are presented for determining a coded modulation scheme, the coded modulation scheme being defined by at least one non-binary error correcting code containing at least one non-binary parity-check equation, a modulation scheme, and a modulation mapping. Two or more candidate modulation mappings and two or more candidate parity-check equations are determined defining the at least one non-binary error correcting code, a candidate set comprising a candidate modulation mapping and at least one candidate parity-check equation providing codeword vectors and being associated with one or more metrics, each metric being evaluated for a number of distinct pairs of codeword vectors having an Euclidean distance of a defined value. One candidate modulation mapping and at least one candidate parity-check equation are selected according to an optimization criterion applied to the one or more metrics.

13 Claims, 5 Drawing Sheets

(51) Int. Cl.
H03M 13/25 (2006.01)
H03M 13/35 (2006.01)
H04L 1/00 (2006.01)

(52) U.S. Cl.
CPC ........ H03M 13/616 (2013.01); H03M 13/116 (2013.01); H04L 1/0041 (2013.01); H04L 1/0045 (2013.01)

(56) References Cited

U.S. PATENT DOCUMENTS

2010/0151898 A1* 6/2010 Lee .................. H04B 1/18
455/522
2011/0252286 A1* 10/2011 Li ..................... H03M 13/1114
714/755
2015/0341144 A1* 11/2015 Myung .............. H04L 1/0071
375/261
2018/0019841 A1* 1/2018 Rekaya Ben-Othman ..................
H04B 10/2581

OTHER PUBLICATIONS

Poulliat C et al: "Design of regular (2,dc)-LDPC codes over GF(q) using their binary images", IEEE Transactions on Communications, IEEE Service Center, Piscataway, NJ. USA, vol. 56, No. 10, Oct. 2008 (Oct. 2008), pp. 1626-1635.

Changuel S et al: "Pragmatic two-level coded modulation using Reed-Solomon product codes", 2007 6th International Conference on Information, Communications & Signal Processing; Singapore; Dec. 10-13, 2007, IEEE, Piscataway, NJ, USA, Dec. 10, 2007 (Dec. 10, 2007), pp. 1-5.

Abdmouleh Ahmed et al: "A new approach to optimise Non-Binary LDPC codes for coded modulations", Sep. 5, 2016 (Sep. 5, 2016), 2016 9th International Symposium on Turbo Codes and Iterative Information Processing (ISTC), IEEE, pp. 295-299.

* cited by examiner

METHODS AND DEVICES FOR GENERATING OPTIMIZED CODED MODULATIONS

TECHNICAL FIELD

The invention generally relates to digital communications and in particular to methods and devices for the construction of non-binary error correcting codes for coded modulations.

BACKGROUND

Noise and/or any form of interference frequently cause the distortion of data in storage and transmission systems.

Error correcting codes deal with reliable transmission and/or storage of data by incorporating some redundant information in the original data. This redundancy enables recovering the original information or at least detecting the presence of errors, even if errors occur up to some tolerance levels.

Error correcting codes are implemented in several digital communication devices and systems to compensate for errors and to provide error-resistant delivery of digital data during its storage and/or transmission.

Exemplary devices implementing error correcting codes comprise computers, disks, cellular phones, base stations, etc. Exemplary applications of error correcting codes comprise transmission systems such as wireless ad-hoc networks (e.g. standardized in Wi-Fi 802.11), radio communication systems (e.g. in 3G, 4G/LTE, 5G and beyond), optical fiber-based transmission systems, and digital video broadcasting (e.g. standardized in DVB-C2, DVB-S2X, and DVB-T2). Non-binary error correcting codes are particularly used in applications requiring a high spectral efficiency.

Existing error correcting codes comprise linear codes, generally categorized into linear block codes and convolutional codes. Linear codes refer to codes that satisfy a linearity property according to which any linear combination of codeword vectors is a codeword vector. Linear block codes are widely used because they are less complex and easier to implement than non-linear codes. Exemplary linear block codes comprise Hamming codes, Reed-Solomon codes, Turbo codes and low-density parity-check (LDPC) codes.

LDPC codes are very efficient linear block codes that can provide high transmission rates that approach the optimum channel capacity, i.e. the theoretical maximum amount of information that can be transmitted over a communication channel. In particular, non-binary LDPC codes are very efficient to provide high-spectral efficiency coding and can achieve better error-correction performance than binary LDPC codes.

Any linear error correcting code can be represented by a generator matrix and a parity-check matrix. The entries (also referred to as 'coefficients') of the generator and parity-check matrices belong to the algebraic structure over which the error correcting code is constructed.

The generator matrix is used in the encoding process to generate codeword vectors. The values of the components of each codeword vector depend thus on the entries of the generator matrix (equivalently on the entries of the parity-check matrix).

The non-zero entries of the parity-check matrix define the parity-check equations designed to be satisfied by the codeword vectors. In addition, the parity-check matrix can be used in the decoding process. In particular, iterative decoders such as the Belief Propagation (BP) algorithm use a graph associated with the code known as the 'Tanner graph'. The positions of the non-zero entries of the parity-check matrix lead to the structure of the Tanner graph and its topological properties such as the number of cycles in the Tanner graph associated with the code. As cycles impact the decoding error performance (efficient codes have a small number of short cycles), the positions of the non-zero entries of the parity-check matrix need to be carefully chosen so as to minimize the number of cycles.

Accordingly, the construction of the parity-check matrix of non-binary linear error correcting codes can be performed in two steps.

In a first step, the positions of the non-zero entries of the parity-check matrix are optimized in order to minimize the impact of cycles on the decoding process. Exemplary algorithms that can be used to achieve this step comprise the 'Progressive Edge Growth' algorithm disclosed in "X.-Y. Hu, E. Eleftheriou, and D. M. Arnold, Regular and Irregular Progressive Edge-Growth Tanner Graphs, IEEE Transactions on Information Theory, Volume 51, pages 386-298, 2005".

In a second step, the values of the non-zero entries of the parity-check matrix are determined. These values may, for example, be selected randomly from a uniform distribution as disclosed in "X.-Y. Hu, E. Eleftheriou, and D. M. Arnold, Regular and Irregular Progressive Edge-Growth Tanner Graphs, IEEE Transactions on Information Theory, Volume 51, pages 386-298, 2005". Alternatively, the values of the non-zero entries can be selected according to specific design criteria such as the maximization of the marginal entropy of elements of the syndrome vector as disclosed in "D. Mackay, Optimizing Sparse Graph Codes over GF(q), available on line, 2003".

Digital modulation techniques convert a digital signal into a modulated signal in the form of a sequence of modulated symbols represented as signal points that belong to a signal constellation (also referred to as 'constellation diagram'). The signal constellation depends on the modulation scheme used and represents the values that can be taken by each symbol as points in the Euclidean space. The components of the digital signal are mapped onto symbols using a modulation mapping which associates a symbol from the signal constellation with each value of the digital signal. Exemplary digital modulation schemes comprise amplitude-shift keying (ASK), frequency-shift keying (FSK), phase-shift keying (PSK), and quadrature amplitude modulation (QAM). Exemplary modulation mappings comprise the Gray mapping which uses a binary representation of the components of the digital signal.

The concatenation of error correcting codes and modulation provides a coded modulation. In coded modulations, coding can be seen as a patterning of the continuous time signals, their phases and/or their amplitudes.

When a coded modulation is used, data is mapped onto sequences of symbols using modulation mappings, introducing redundancy to improve error performance. Codeword vectors are mapped onto points in the signal constellation in a way that enhances the distance properties of the error correcting code. The resulting modulated codeword vector can be seen as a vector of signal points (constellation points). The distance between any two modulated codeword vectors can be determined from the Euclidean distance between the signal points representing each vector in the Euclidean Space. For binary modulations, the Hamming distance of the error correcting code is equivalent to the Euclidean distance of the modulated codeword vectors. The values and the positions of the non-zero entries of the parity-check matrix can be optimized as described above in a way that maximizes the Hamming distance of the code.

For non-binary modulations, the Euclidean distance of modulated codeword vectors is not equivalent to the Hamming distance of the error correcting code. In addition, the Euclidean distance properties depend on the modulation mapping used to map the codeword vectors onto signal points. As a result, the construction of parity-check matrices of non-binary error correcting codes for coded modulations according to the maximization of the Hamming distance is sub-optimal. There is accordingly a need for constructing efficient non-binary coded modulations involving error correcting codes that are optimized for the Euclidean distance rather than the Hamming distance and are adapted to the modulation mapping and signal modulations that are used.

SUMMARY

In order to address these and other problems, there is provided a device for determining a coded modulation scheme used to encode and modulate a digital data sequence. The coded modulation scheme is defined by at least one non-binary parity-check code containing at least one non-binary parity-check equation associated with a modulation scheme and a modulation mapping. The at least one non-binary parity-check equation is represented by one or more coefficients. The modulation scheme is represented by a set of symbols. The device (referred to as a 'coded modulation device') comprises:

a calculation unit configured to determine one or more candidate modulation mappings and one or more candidate parity-check equations defining the least one non-binary parity-check code. Each set comprising a candidate modulation mapping and at least one candidate parity-check equation provides codeword vectors and is associated with one or more metrics. Each metric is defined by a number of distinct pairs of codeword vectors having an Euclidean distance of a defined value; and a selection unit configured to select one candidate modulation mapping and at least one candidate parity-check equation according to an optimization criterion applied to the one or more metrics.

According to some embodiments, the at least one non-binary parity-check code may be defined by a set of values.

According to some embodiments, each candidate parity-check equation may be represented by one or more non-zero coefficients. The calculation unit may be configured to determine the one or more candidate parity-check equations by determining a value of at least one coefficient from the set of values defined the at least one non-binary parity-check code.

According to some embodiments, the calculation unit may be configured to determine the one or more candidate modulation mappings from a predefined set of modulation mappings.

According to some embodiments, the optimization criterion may comprise the minimization of at least one metric from the one or more metrics.

In some embodiments, the modulation scheme may be selected in a group consisting of a phase-shift keying modulation, a frequency-shift keying modulation, and a quadrature amplitude modulation.

In some embodiments, the at least one non-binary parity-check code may be defined by a set of values comprising a number of values, the number of values being a power of two.

In such embodiments, the calculation unit may be further configured to associate a binary vector with each value comprised in the set of values and to determine at least one candidate modulation mapping using the binary vectors associated with at least some of the values of the set of values. The at least one candidate modulation mapping associates a symbol from the set of symbols with each binary vector. Each binary vector comprises a plurality of bits.

According to some embodiments, the calculation unit may be configured to determine one or more vector permutations, each vector permutation being applied to permute at least some of the bits comprised in the binary vector associated with each value of the set of values, thereby providing a permuted binary vector in association with each value. The calculation unit may be configured to determine the one or more candidate modulation mappings by applying the at least one candidate modulation mapping to the permuted binary vectors.

In some embodiments, the predefined set of modulation mappings may comprise modulation mappings selected in a group consisting of Gray mappings and natural mappings.

In one application to communication systems, there is provided a transmitter configured to transmit a data sequence over a transmission channel in a transmission system. The data sequence is encoded and modulated by a coded modulation scheme. The coded modulation scheme is defined by at least one non-binary error correcting code containing at least one non-binary parity-check equation, a modulation scheme, and a modulation mapping, and is determined as an output of a device according to some embodiments of the invention.

According to some embodiments, the transmission channel may be associated with a transmission power. In such embodiments, the transmitter may be configured to determine the modulation scheme depending on the transmission power.

Still in application to communication systems, there is also provided a receiver configured to receive and decode a data sequence transmitted by a transmitter according to any preceding feature.

There is also provided a method of determining a coded modulation scheme. The coded modulation scheme is defined by at least one non-binary error correcting code containing at least one non-binary parity-check equation, a modulation scheme, and a modulation mapping. The method comprises:

determining one or more candidate modulation mappings and one or more candidate parity-check equations defining the at least one non-binary error correcting code. Each set comprising a candidate modulation mapping and at least one candidate parity-check equation provides codeword vectors and is associated with one or more metrics. Each metric is defined by a number of distinct pairs of codeword vectors having an Euclidean distance of a defined value; and selecting one candidate modulation mapping and at least one candidate parity-check equation, according to an optimization criterion applied to the one or more metrics.

Advantageously, the various embodiments allow a joint optimization of the values of the non-zero coefficients defining at least one parity-check equation representing a non-binary parity-check code and the modulation mappings in particular for high-order modulations. The joint optimization enables the minimization of the decoding error probability.

Further advantages of the present invention will become clear to the skilled person upon examination of the drawings and the detailed description.

BRIEF DESCRIPTION OF DRAWINGS

The accompanying drawings, which are incorporated in and constitute a part of this specification, illustrate various embodiments of the invention together with the general description of the invention given above, and the detailed description of the embodiments given below.

DETAILED DESCRIPTION

Embodiments of the present invention provide devices, methods, and computer program products for constructing coded modulation schemes involving error correcting codes and modulation mappings jointly optimized for providing better decoding error performances. In particular, the various embodiments provide improved joint constructions of non-binary error correcting codes and modulation mappings for higher-order coded modulations.

The various embodiments provide coded modulation schemes to be used for encoding and modulating a digital data sequence. The provided coded modulation schemes may be implemented in devices and systems configured to convert digital data sequences into coded modulation symbols.

Coded modulations can improve system spectral efficiency and provide resistance to impairments in transmission and storage systems. In particular, the association of non-binary error correcting codes and high-order modulations provides higher data throughputs and higher spectral efficiency transmission.

Devices, methods, and computer program products according to the various embodiments of the present invention may be implemented in numerous types of digital storage and transmission devices and systems used in different types of applications. Exemplary devices and systems comprise computers, disks, laptops, phones, smartphones, recorders, base stations, drones, satellites, etc. Exemplary applications comprise magnetic and optical recording, digital television and video broadcasting, digital communications, etc.

The following description of certain embodiments of the invention will be made with reference to communication systems, for illustration purpose only. However, the skilled person will readily understand that the various embodiments of the invention may be integrated in other types of systems used for other applications such as positioning systems and spacecraft systems.

Figure 1:
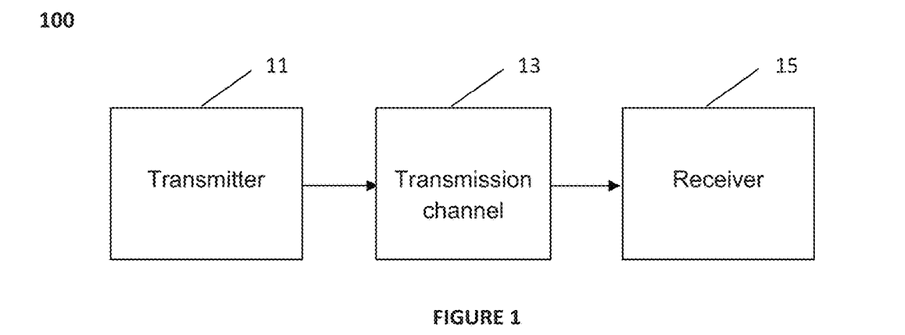
FIG. 1 illustrates an exemplary application of the invention to communication systems, according to some embodiments.

FIG. 1 illustrates an exemplary application of the invention in a communication system 100. The communication system 100 may be for example:
wired (e.g. optical fiber-based);
wireless (e.g. radio communication systems);
acoustic (e.g. underwater acoustic communication systems);
molecular (used for example in underground structures e.g. tunnels and pipelines or in underwater environments).

The communication system 100 may comprise at least one transmitter device 11 (hereinafter referred to as a "transmitter") configured to transmit a plurality of information symbols to at least one receiver device 15 (hereinafter referred to as "receiver") through a transmission channel 13. The receiver device 15 may be configured to receive the conveyed signal by the transmitter 11 and decode it for recovering the original data. The transmission channel 13 may be a wired connection, a wireless medium, an underwater communication channel, etc.

In an application of the invention to wired communication systems such as computer networking systems, the transmitter 11 and/or the receiver 15 may be any device configured to operate in a wired network. Exemplary devices in such application comprise computers, routers or switches connected to a small or large area wired network. Further, in such an application, the transmission channel 13 may be any type of physical cable used to ensure the transfer of data between the different connected devices in the wired network.

In another application of the invention to wireless communication systems such as ad-hoc wireless networks, wireless sensor networks and radio communication systems, the transmitter 11 and/or the receiver 15 may be any type of fixed or mobile wireless device configured to operate in a wireless environment. Exemplary devices adapted for such application comprise laptops, tablets, mobile phones, robots, IoT (Internet of Things) devices, base stations, etc. The transmission channel 13 may be any wireless propagation medium suitable for this type of application. Further, the transmission channel 13 may accommodate several pairs of transmitters 11 and receivers 15. In such embodiments, multiple access techniques and/or network coding techniques may be used in combination with error correcting codes and modulation. Exemplary multiple access techniques comprise Time Division Multiple Access (TDMA), Frequency Division Multiple Access (FDMA), Code Division Multiple Access (CDMA), and Space Division Multiple Access (SDMA).

In still another application of the invention to optical communication systems such as optical fiber-based systems, the transmitter 11 and the receiver 15 may be any optical transceiver device configured respectively to transmit and to receive data information propagated over an optical link. Exemplary optical communication systems comprise Polarization Division Multiplexing (PMD) and Mode Division Multiplexing (MDM) systems.

For any type of wired, wireless or deep-space (e.g. satellites, telescopes, space probes, etc.) communication systems, the transmission channel 13 may be any noisy channel. The noise may result from the thermal noise of the system components and/or the intercepted interfering radiation by antennas. Other exemplary sources of noise comprise switching, manual interruptions, electrical sparks and lightning. In some embodiments, the total noise may be modeled by an additive white Gaussian noise (AWGN).

Further, according to another application of the invention to digital mass storage, the transmission channel 13 may be modeled for example by an erasure channel, a binary symmetric channel, or a Gaussian channel. In such application, the transmission channel 13 may be any type of storage device which can be sent to (i.e. written) and received from (i.e. read).

The various embodiments of the invention may be implemented at the transmitter 11 for encoding and modulating a sequence of data to be sent to the receiver 15 through the transmission channel 13.

Figure 2:
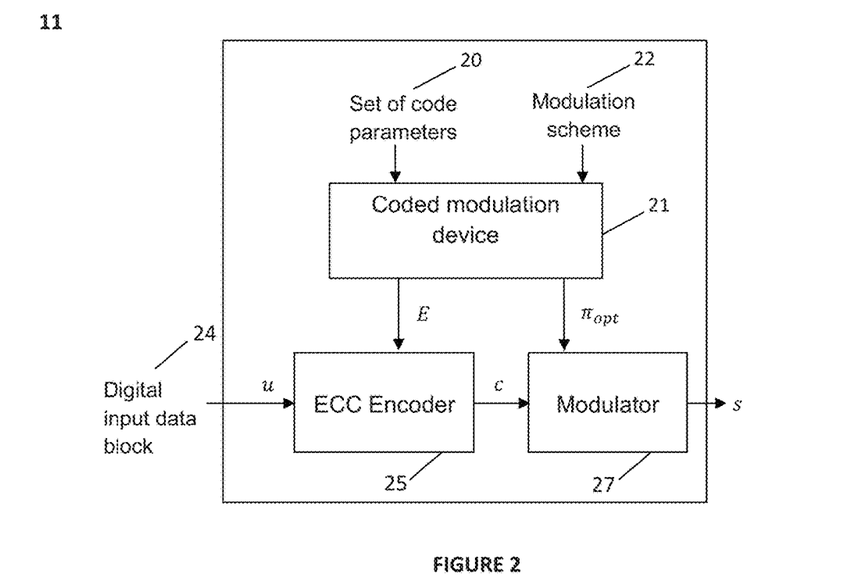
FIG. 2 is a block diagram illustrating the structure of a transmitter device in a communication system, according to some embodiments.

Referring to FIG. 2, there is illustrated a structure of a transmitter 11, according to some embodiments of the invention. The transmitter 11 may be configured to receive a digital input data block 24 denoted by u and to generate a modulated sequence of symbols denoted by s. The components of the digital input data block 24 belong to a given algebraic structure denoted by F. The symbols comprised in the modulated sequence of symbols s belong to a set of symbols denoted by $\mathcal{S}$ which depends on the given modulation scheme 22, denoted by $\mathcal{M}$. Each symbol in the set of symbols $\mathcal{S}$ is represented by a signal point in the constellation diagram associated with the modulation scheme 22.

According to some embodiments, there is provided a coded modulation device 21 configured to determine an optimized coded modulation scheme providing at least one non-binary parity-check code defined by one non-binary parity-check equation and a modulation mapping, for a given modulation scheme 22 and a given set of error correcting code parameters 20.

According to some embodiments, the transmitter 11 may implement a concatenation of an error correcting code (ECC) encoder 25 and a modulator 27.

The ECC encoder 25 may be configured to encode the digital input data block 24 into a codeword vector c, using the at least one parity-check error correcting code provided by coded modulation device 21, said one parity-check error correcting code being constructed over the algebraic structure F to which the components of the digital input data block 24 belong.

The modulator 27 may be configured to generate the modulated sequence of symbols s by applying the modulation mapping provided by the coded modulation device 21, the modulation mapping associating the components of the codeword vector c to symbols comprised in the set of symbols $\mathcal{S}$.

According to some embodiments, the coded modulation device 21 may be implemented in the transmitter 11 for providing the coded modulation scheme to be used by the ECC encoder 25 and the modulator 27. In such embodiments, the coded modulation device 21 may be configured to determine the jointly optimized coded modulation scheme offline, during a pre-transmission phase, and to provide thereafter the one parity-check error correcting code and the modulation mapping respectively to the ECC encoder 25 and the modulator 27. In such implementation, the transmitter 11 may be further configured to communicate the parameters of the coded modulation scheme to the receiver 15, for implementing the demodulation and decoding operations accordingly.

According to other embodiments (not illustrated in FIG. 2), the coded modulation device 21 may be implemented in other device(s) (e.g. a centralized maintenance or configuration system) being able to broadcast the coded modulation scheme to both the transmitter 11 and the receiver 15. In such embodiments, the transmitter 11 and the receiver 15 may be further configured to previously store the modulation scheme 22 and the set of error correcting code parameters 20.

The following description will be made with reference to linear non-binary error correcting codes, for illustration purpose only. However the skilled person will readily understand that any non-binary error correcting code, such as non-binary turbo codes and non-binary convolutional codes, may be considered. Further, the non-binary error correcting codes are assumed one parity-check codes, defined by one parity-check equation.

Accordingly, the set of error correcting code parameters 20 may comprise:
the algebraic structure F over which at least one non-binary parity-check error correcting code is constructed, and
a size $N_{row}$ According to the set of parameters 20, the non-binary parity-check error correcting code can be defined by one parity-check equation $E(h_1, \ldots, h_{N_{row}})$ represented by a set of non-zero coefficients $\{h_1, \ldots, h_{N_{row}}\}$ comprising at least one unknown coefficient, the parity-check equation defining a parity-check constraint over the algebraic structure F.

The following description of some embodiments of the invention will be made with reference to coded modulation schemes involving one non-binary error correcting code, for illustration purpose only. However, the skilled person will readily understand that the various embodiments apply to any concatenation of two or more non-binary error correcting codes. The concatenation of two or more codes may be a serial concatenation, a parallel concatenation or a multi-level coding architecture. It should be noted that concerning the embodiments involving two or more codes, the coded modulation device 21 may be configured to determine optimized coefficients of at least one parity-check equation defining each code and to determine a modulation mapping associating the components of the codeword vector resulting from the concatenation of the two or more non-binary error correcting codes with symbols from the set of symbols $\mathcal{S}$.

Further, the following description will be made with reference to one parity-check equation denoted by $E(h_1, \ldots, h_{N_{row}})$, for illustration purpose only. However, it may be contemplated to apply the invention to two or more parity-check equations.

The parity-check equation defines therefore a code over $F^{N_{row}}$. Accordingly, a generated codeword vector by the ECC encoder 25 has a length $N_{row}$, can be written in a vector form as $c=(c_1, \ldots, c_{N_{row}})$, and satisfies the parity-check equation according to:

$$E(h_1, \ldots, h_{N_{row}}): \Sigma_{p=1}^{N_{row}} h_p c_p = 0 \quad (1)$$

The components of the digital input block 24 and the components $c_j$, for $j=1, \ldots, N_{row}$, of the codeword vectors belong to the algebraic structure F.

In addition, the generated codeword vectors belong to a set of codeword vectors, referred to as 'codebook', denoted by $C_{opt}$. The codebook $C_{opt}$ comprises the set of all possible values of the codeword vectors. The total number of codeword vectors in the codebook $C_{opt}$ represents the cardinality of the codebook, denoted by $\text{card}(C_{opt}) = |C_{opt}|$. For one parity-check codes considering one parity-check equation, the codebook $C_{opt}$ corresponds to the set of the vectors $c \in F^{N_{row}}$ that satisfy the parity-check equation $E(h_1, \ldots, h_{N_{row}})$ In the following, a codeword vector $c \in F^{N_{row}}$ refers to a vector satisfying the parity-check equation $E(h_1, \ldots h_{N_{row}})$ and generated using a one parity-check code.

Accordingly, the coded modulation device 21 may be configured to determine a coded modulation scheme denoted by $\{\mathcal{C}_{opt}(F, E), \pi_{opt}\}$, defined by a one parity-check code denoted by $\mathcal{C}_{opt}(F, E)$ and a modulation mapping denoted by $\pi_{opt}$. It should be noted that the code and the modulation mapping are optimized jointly.

According to some embodiments, the algebraic structure F may be any non-zero commutative division ring, also called a "field". Exemplary fields comprise the field of real numbers, the field of complex numbers, the field of rational numbers, and finite fields (also known as 'Galois fields').

The following description of some embodiments will be made with reference to finite fields, for illustration purpose only. However the skilled person will readily understand that the invention may be applied to any division rings-like algebraic structures such as non-zero commutative division rings and to any near-rings such as finite division near-rings. Insights on the design of non-binary error correcting codes over finite division near-rings can be found in the article "Non-binary LDPC codes over finite division near rings," 2016 23rd International Conference on Telecommunications (ICT), Thessaloniki, 2016, pp. 1-7".

A finite field is represented by a set of values of a finite number. The number of values in said set of values represents the order of the finite field. In the following, the set of values of finite fields F=GF will be denoted by GF(q), q designating the order of the finite field GF. The components of the digital input block 24 and the components of the codeword vectors comprised in the codebook $C_{opt}$ are accordingly selected from the set of values GF(q).

Non-binary error correcting codes constructed over Galois fields correspond to GF(q) with q>2. Non-binary error correcting codes can advantageously be used for high spectral efficiency coding.

Using coded modulations, the modulator 27 may be configured to determine a modulated sequence s from the received codeword vector c, by applying the modulation mapping $\pi_{opt}$ determined by the coded modulation device 21.

The modulation mapping $\pi_{opt}$ associates each value in the set of values GF(q) with a symbol from the set of symbols $\mathcal{S}$. The generated modulated sequence s is accordingly a sequence of symbols, each symbol being represented as a point in the signal constellation associated with the modulation scheme 22. The signal constellation comprises a number of points (hereinafter referred to as 'signal points' or 'constellation points'), each point corresponding to a symbol in the set of symbols $\mathcal{S}$.

According to some embodiments, the modulation scheme 22 may be one-dimensional. In such embodiments, the signal constellation is a one-dimensional diagram in which the signal points belong to a same line. Exemplary one-dimensional modulation schemes 22 comprise pulse amplitude modulations (PAM).

According to other embodiments, the modulation scheme 22 may be two-dimensional. In such embodiments, the signal constellation is a diagram in the complex plane represented by the two-dimensional Euclidean space. More specifically, the signal constellation is a sub-set of the two-dimensional real field $\mathbb{R}^2$, in which each signal point is represented by a couple of coordinates that depend on the modulation scheme used 22. The symbols are accordingly represented as complex numbers modulating a cosine and sine carrier signal with the real and imaginary parts and can be sent using two carriers on the same frequency, referred to as 'quadrature carriers'.

The real and imaginary axes in the complex plane are respectively called the 'in phase' and the 'quadrature' axes. Accordingly, for two-dimensional modulation schemes 22, a modulation mapping $\pi$ associates each value of the components $c_j$ in the set of values GF(q) with a symbol $s_j \in \mathcal{S}$ according to:

$$\pi: GF(q) \to \mathbb{R}^2$$

$$c_j \mapsto \pi(c_j) = (\pi^I(c_j), \pi^Q(c_j)) = s_j = (s_j^I, s_j^Q) \quad (2)$$

In equation (2), $s_j^I = \pi^I(c_j)$ (respectively $s_j^Q = \pi^Q(c_j)$) designates the in-phase (respectively the quadrature) coordinate of the mapped component $\pi(c_j)$.

Exemplary two-dimensional modulation schemes 22 comprise frequency-shift keying (FSK), phase-shift keying (PSK), and quadrature amplitude modulation (QAM).

The number of symbols comprised in the set of symbols $\mathcal{S}$ (respectively the number of points in the signal constellation) represents the order of the modulation scheme 22.

Still in other embodiments, the modulation scheme 22 may be a multi-dimensional modulation of a dimension higher than or equal to three. Exemplary multi-dimensional modulation formats comprise polarization-multiplexed QAM and polarization-multiplexed QPSK used for example in optical fiber communications.

According to some embodiments, the modulation scheme 22 may be a higher-order modulation, i.e. a modulation of an order higher than or equal to four (4).

According to some embodiments, the order of the modulation scheme 22 may be equal to the order of the finite field over which the parity-check error correcting code is constructed.

According to other embodiments, the order of the modulation scheme 22 may be different from the order of the finite field GF.

For any dimension and any order of the modulation scheme 22, the distance between each two different signal points in the corresponding signal constellation corresponds to the Euclidean distance between the two points in the Euclidean space ($\mathbb{R}$ for one-dimensional modulation schemes and $\mathbb{R}^2$ for two-dimensional modulation schemes). In particular, the minimum Euclidean distance of the modulation scheme 22 corresponds to the smallest Euclidean distance evaluated over all different signal points representing the different symbols in the set of symbols $\mathcal{S}$.

Accordingly, for two-dimensional modulation schemes 22, the Euclidean distance $d_\mathcal{M}(s_j, s_l)$ between two signal points $s_j \neq s_l$ can be written according to:

$$d_\mathcal{M}(s_j, s_l) = \sqrt{(s_j^I - s_l^I)^2 + (s_j^Q - s_l^Q)^2} \tag{3}$$

The minimum Euclidean distance of the modulation scheme 22 is then given by:

$$d_{\mathcal{M},min} = \min_{\substack{(s_i, s_j) \in S^2 \\ s_i \neq s_j}} d_\mathcal{M}(s_i, s_j) \tag{4}$$

It should be noted that, for coded modulations, the minimum Euclidean distance of any modulation scheme 22 does not depend on the modulation mapping.

According to some embodiments, the modulation scheme 22 may be predefined.

According to other embodiments, the transmitter 11 may be configured to determine the modulation scheme 22 for example according to the satisfaction of a transmission power constraint and/or depending on the minimum Euclidean distance of the signal constellation corresponding to said modulation scheme 22 and/or depending on the coding rate and/or the length of the error correcting code, and/or on the signal-to-noise ratio.

For coded modulations and using the definition of a modulation mapping and the Euclidean distance of the modulation scheme 22, any two values $c_j \neq v_j$ in the set of values GF(q) mapped using a modulation mapping $\pi$ onto two symbols $s_j = \pi(c_j)$, $z_j = \pi(v_j)$ may be associated with an Euclidean distance, denoted by $D_{\mathcal{M},\mathcal{C},\pi}(c_j, v_j)$. The Euclidean distance $D_{\mathcal{M},\mathcal{C},\pi}(c_j, v_j)$ may be determined using the Euclidean distance between the signal points representing the symbols associated with the two values $c_j \neq v_j$.

For two-dimensional modulation schemes 22, the Euclidean distance $D_{\mathcal{M},\mathcal{C},\pi}(c_j, v_j)$ may be given by:

$$D_{\mathcal{M},\mathcal{C},\pi}(c_j, v_j) = d_\mathcal{M}(s_j, z_j) = \sqrt{(\pi^I(c_j) - \pi^I(v_j))^2 + (\pi^Q(c_j) - \pi^Q(v_j))^2} = \sqrt{(s_j^I - z_j^I)^2 + (s_j^Q - z_j^Q)^2} \tag{5}$$

Accordingly, any pair of different codeword vectors $c = (c_1, \ldots, c_{N_{row}}) \neq v = (v_1, \ldots, v_{N_{row}})$ in the codebook C generated using an error correcting code $\mathcal{C}$ may be associated with an Euclidean distance $D_{\mathcal{C},\pi}(c, v)$ of a square value given by:

$$D^2_{\mathcal{C},\pi}(c,v) = \sum_{j=1}^{N_{row}} D^2_{\mathcal{M},\mathcal{C},\pi}(c_j, v_j) \tag{6}$$

It should be noted that the Euclidean distance $D_{\mathcal{C},\pi}(c, v)$ depends on the values of the components of the codeword vectors which depend on the non-zero coefficients of the parity-check equation and on the modulation mapping. Furthermore, the distance can be adapted to the type of the transmission channel. For example, for flat fading channels, a distance product can be used.

Using the definition in the Euclidean space of the Euclidean distance $D_{\mathcal{C},\pi}(c, v)$ associated with each pair of codeword vectors generated using the one parity-check code $\mathcal{C}$ and mapped using the mapping $\pi$, a set $\{\mathcal{C}, \pi\}$ of a non-binary parity-check error correcting code $\mathcal{C}$ and a modulation mapping $\pi$ may be associated with one or more metrics, each metric being evaluated for a given Euclidean distance value.

According to some embodiments, a metric denoted by $S_{\mathcal{C},\pi}(d_l)$ evaluated for a given Euclidean distance value $d_l$ may represent the number of distinct pairs of codeword vectors $c \neq v$ satisfying the parity-check equation E and generated by the one parity-check code $\mathcal{C}$ that are associated with an Euclidean distance $D_{\mathcal{C},\pi}(c, v)$ equal to the Euclidean distance value $d_l$ according to:

$$S_{\mathcal{C},\pi}(d_l) = |(c,v) \in C^2, D^2_{\mathcal{C},\pi}(c,v) = d_l^2| \tag{7}$$

According to some embodiments, the metrics $S_{\mathcal{C},\pi}(d_l)$ may be evaluated for each possible Euclidean distance value between two different codeword vectors in the codebook C corresponding to the one parity-check code $\mathcal{C}$. The enumeration of the metrics $S_{\mathcal{C},\pi}(d_l)$ evaluated for all the possible Euclidean distance values $d_l$ defines a distance spectrum of the set $\{\mathcal{C}, \pi\}$ of the parity-check code and the modulation mapping.

According to some embodiments, the coded modulation device 21 may be configured to determine the coded modulation scheme $\{\mathcal{C}_{opt}(F, E), \pi_{opt}\}$ based on the evaluation of the distance spectrum. More specifically, it depends on the values of one or more metrics each evaluated for a given Euclidean distance.

Figure 3:
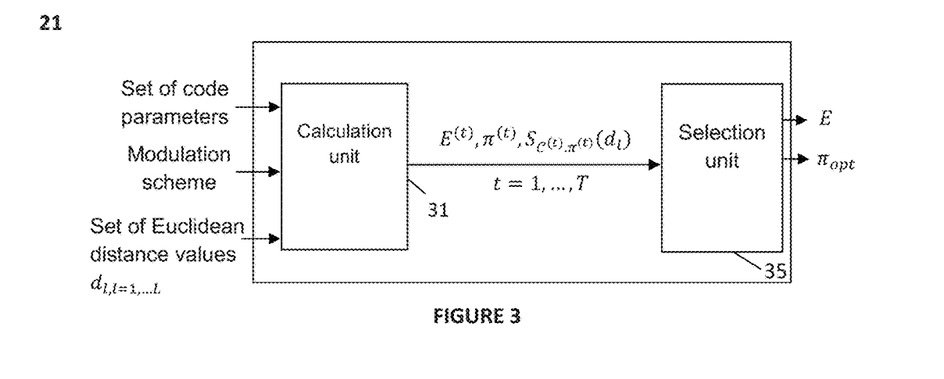
FIG. 3 is a block diagram representing the structure of a coded modulation device, according to some embodiments.

Referring to FIG. 3, there is illustrated a structure of a coded modulation device 21, according to some embodiments in which the distance spectrum is evaluated for a set of Euclidean distance values comprising L Euclidean distances $d_{l,l=1,\ldots,L}$.

Accordingly, the coded modulation device 21 may comprise a calculation unit 31, configured to determine one or more candidate modulation mappings $\pi^{(t)}$ and one or more candidate parity-check equations $E^{(t)}$ for $t = 1, \ldots, T$.

The determined candidate modulation mappings and candidate parity-check equations may be grouped into candidate sets denoted by $\{E^{(t)}, \pi^{(t)}\}$ for $t = 1, \ldots, T$. A candidate set $\{E^{(t)}, \pi^{(t)}\}$ comprises a candidate parity-check equation $E^{(t)}$ and a candidate modulation mapping denoted by $\pi^{(t)}$.

Accordingly, the candidate set $\{E^{(t)}, \pi^{(t)}\}$ is equivalent to the candidate set $\{\{h_1, \ldots, h_{N_{row}}\}^{(t)}, \pi^{(t)}\}$ comprising a candidate set of coefficients $\{h_1, \ldots, h_{N_{row}}\}^{(t)}$ defining the parity-check equation $E^{(t)}$ and a candidate modulation mapping $\pi^{(t)}$.

According to some embodiments, the calculation unit 31 may be configured to determine the candidate sets $f\{\{h_1, \ldots, h_{N_{row}}\}^{(t)}, \pi^{(t)}\}$ for $t = 1, \ldots, T$, by performing two steps.

At a first step, the calculation unit 31 may be configured to determine one or more candidate modulation mappings $\pi^{(t)}$. A candidate modulation mapping consists of a labeling of each symbol in the set of symbols $S$ with corresponding values in the set of values in GF(q).

According to some embodiments, the calculation unit 31 may be configured to determine the candidate modulation mappings $\pi^{(t)}$ for $t = 1, \ldots, T$ from a predefined set of modulation mappings. Exemplary modulation mappings comprise the Gray mappings and the natural mappings.

Gray mappings are based on a labeling of symbols such that the labels, associated with each two adjacent signal points in the signal constellation, differ in only one position. Gray mappings may be used for example in some applications for Euclidean distance preservation.

Natural mappings are based on a labeling of symbols in an integer-wise ascending order. Natural mappings may be used, for example, in applications which require robustness against carrier phase errors.

Further, the modulation mappings may be any mappings based on a labeling of symbols so that each two adjacent points in the signal constellation differ at least of one position (one bit using binary representations of symbols).

At a second step, the calculation unit 31 may be configured to determine, for each candidate modulation mapping $\pi^{(t)}$, a candidate set of coefficients $\{h_1, \ldots h_{N_{row}}\}^{(t)}$ defining the parity-check equation $E^{(t)}$ in a way that the coefficients satisfy the parity-check equation and enable the optimization of the properties of the distance spectrum evaluated for one or more predefined Euclidean distances $d_{l,l=1,\ldots,L}$.

According to some embodiments, the calculation unit 31 may be configured to determine, for each candidate modulation mapping $\pi^{(t)}$, the values of the unknown coefficients comprised in the candidate set of coefficients $\{h_1, \ldots, h_{N_{row}}\}^{(t)}$, by applying an exhaustive search over the set of values GF (q)

Given the determined values of the non-zero coefficients defining the parity-check equation, each candidate set $\{\{h_1, \ldots, h_{N_{row}}\}^{(t)}, \pi^{(t)}\}$ for $t=1, \ldots, T$ provides a candidate one parity-check code denoted $\mathcal{C}^{(t)}(\text{GF}, E^{(t)})$ and a number of codeword vectors that belong to the codebook, denoted $C^{(t)}$, generated using the candidate parity-check equation $E^{(t)}$.

Using the determined candidate modulation mapping $\pi^{(t)}$, for $t=1, \ldots, T$, each pair of different codeword vectors $c^{(t)} \neq v^{(t)}$ in the codebook $C^{(t)}$ may be associated with an Euclidean distance $D_{\mathcal{C}^{(t)},\pi^{(t)}}(c^{(t)}, v^{(t)})$ of a square value given according to equation (6).

Each candidate set $\{E^{(t)}, \pi^{(t)}\}$ or equivalently each candidate set $\{\{h_1, \ldots, h_{N_{row}}\}^{(t)}, \pi^{(t)}\}$ may be associated with one or more metrics evaluated for the given set comprising L Euclidean distance $d_{l,l=1,\ldots,L}$. $S_{\mathcal{C}^{(t)},\pi^{(t)}}(d_l)$ designates the metric associated with the $t_{th}$ candidate set $\{\{h_1, \ldots, h_{N_{row}}\}^{(t)}, \pi^{(t)}\}$ and evaluated for the distance $d_{l,l=1,\ldots,L}$, according to equation (7).

The coded modulation device 21 may further comprise a selection unit 35 configured to select one set denoted by $\{E, \pi^{(opt)}\}$ from the candidate sets $\{E^{(t)}, \pi^{(t)}\}$ for $t=1, \ldots, T$ according to an optimization criterion applied to at least one metric among the determined one or more metrics. The selected set $\{E, \pi^{(opt)}\} = \{\mathcal{C}^{(opt)}(\text{GF}, E^{(opt)}), \pi^{(opt)}\}$ provides the coded modulation scheme as $\{\mathcal{C}_{opt}(F, E), \pi_{opt}\} = \{\mathcal{C}^{(opt)}(\text{GF}, E^{(opt)}), \pi^{(opt)}\}$. It should be noted that the optimization criterion is based on a joint optimization of the non-zero coefficients of the parity-check equation and the modulation mapping.

According to some embodiments, the selection unit 35 may be configured to select the set $\{E, \pi^{(opt)}\}$ according to the minimization of at least one metric from the evaluated one or more metrics.

For example, in embodiments involving the evaluation of one metric for a given distance $d_l$, the selected set $\{E, \pi^{(opt)}\}$ may correspond to the candidate set associated with the smallest metric $S_{\mathcal{C}^{(t)},\pi^{(t)}}(d_l)$ for $t=1, \ldots, T$ such that:

$$\{E, \pi^{(opt)}\} = \operatorname{argmin}_{\{\{h_1,\ldots,h_{N_{row}}\}^{(t)},\pi^{(t)}\} \atop t=1,\ldots,T} S_{\mathcal{C}^{(t)},\pi^{(t)}}(d_l) \qquad (8)$$

According to some embodiments, the number T of the possible candidate modulation mappings may depend on the order of the modulation scheme 22.

Figure 4:
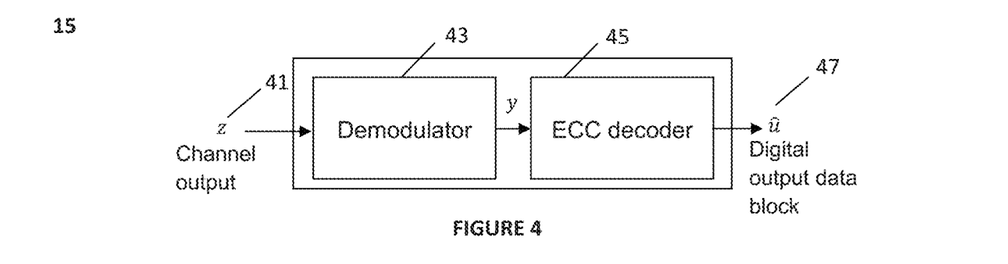
FIG. 4 is a block diagram representing the structure of a receiver device in a communication system, according to some embodiments.

According to some embodiments, the number and/or values of the Euclidean distances $d_{l,l=1,\ldots,L}$ considered for the evaluation of the distance spectrum may be determined based on the evaluation of the decoding error probability, at the receiver 15.

The decoding error probability, in particular the pair-wise error probability, is related to the Euclidean distance of the coded modulations. For simplification reasons, the following description of the decoding error probability analysis at the receiver 15 will be made based on a coded modulation scheme denoted by $\{\mathcal{C}, \pi\}$.

Referring to FIG. 4, there is illustrated a structure of a receiver 15, according to some embodiments of the invention. The receiver 15 may be configured to receive a channel output 41 denoted by z and generate a digital output data block 47 denoted by $\hat{u}$ as an estimate of the original digital input data block 24.

According to some embodiments in which the transmission channel 13 is modeled by an Additive White Gaussian Noise (AWGN) channel, the channel output 41 z can be written as a function of the transmitted codeword vector c according to:

$$z = \pi(c) + w \qquad (9)$$

In equation (9), the vector $w=(w_1, \ldots, w_{N_{row}})$ is a complex-value vector designating the realization of a complex Gaussian noise of variance $$\sigma^2 = \frac{N_0}{2},$$

with $N_0$ representing the power spectral density of the AWGN.

According to some embodiments, the receiver 15 may comprise a demodulator 43 configured to determine a digital sequence $y=(y_1, \ldots, y_{N_{row}})$ from the received channel output 41, by applying a demodulation operation.

The receiver 15 may further comprise an ECC decoder 45 configured to determine the digital output data block 47 from the received digital sequence y, by applying an ECC decoding algorithm and according to a decoding criterion.

According to some embodiments, the ECC decoder 45 may be configured to implement an ECC decoding algorithm, according to the Maximum Likelihood (ML) decoding criterion. For a given signal-to-noise ratio (SNR), the pair-wise error probability under ML decoding can be expressed as:

$$Pr(c \to v) = \operatorname{Prob}(\|z-\pi(c)\|^2 > \|z-\pi(v)\|^2) \qquad (10)$$

In equation (10), $Pr(c \to v)$ designates the pair-wise error probability corresponding to the error probability that for a transmitted codeword vector c, a different codeword vector v is estimated.

For AWGN channels, the pair-wise error probability in equation (10) can be written:

$$Pr(c \to v) = Q\left(\frac{D_{\mathcal{C},\pi}(c, v)}{2\sigma}\right) \qquad (11)$$

In equation (12), Q(.) designates the Q-function defined by:

$$Q(x) = \frac{1}{\sqrt{2\pi}} \int_x^{+\infty} \exp\left(-\frac{t^2}{2}\right) dt \qquad (12)$$

Using the union bound inequality, the probability Pe(σ) of a decoding error on a received codeword vector can be upper bounded according to:

$$Pe(\sigma) \leq \frac{1}{|C|} \sum_{c \in C} \sum_{\substack{v \in C \\ v \neq c}} Pr(c \to v) = \frac{1}{|C|} \sum_{d_l} S_{C,\pi}(d_l) Q\left(\frac{d_l}{2\sigma}\right) \quad (13)$$

In equation (13), the Euclidean distance $d_l$ corresponds to a possible Euclidean distance associated to any pair of codeword vectors in the codebook C. Details on the derivation of the union bound inequality can be found in "J. Proakis, M. Salehi, Digital Communications, Fifth Edition, Chapter 7, p. 400-492, Mc Graw-Hill International Edition (2008)".

According to the upper bound expression in inequality (13), the decoding error probability may depend on the metrics $S_{C,\pi}(d_l)$ evaluated for one or more Euclidean distances $d_{l,l=1,\ldots,L}$. For example, at high signal-to-noise ratio, the upper bound of the decoding error probability is dominated by the first term corresponding to $d_1$. As a result, the determination of the one parity-check error correcting code $\mathcal{C}^{(opt)}$ (k, n, GF, $E^{(opt)}$) and the modulation mapping $\pi^{(opt)}$, based on the distance spectrum evaluation, enables improving the reduction of the decoding error probability.

According to some embodiments, the number of the Euclidean distances considered for the distance spectrum evaluation may depend on the signal-to-noise ratio. For example, for large SNR values, the distance spectrum may be evaluated using only the smallest possible Euclidean distance which concerns the pairs of codeword vectors associated with the minimum Euclidean distance in the Euclidean space. Indeed, for high SNR values, the upper bound on the decoding error probability can be approximated by the first dominating terms which involve the smallest values of the possible Euclidean distances between the pairs of codeword vectors.

According to some embodiments, the ECC decoder 45 may implement the Viterbi decoder as an ECC decoding algorithm.

According to other embodiments, the ECC decoder 45 may be any Belief Propagation iterative decoder such as the Extended Min-Sum (EMS) algorithm.

Further, according to some embodiments in which the order of the modulation scheme 22 and the order of Galois field are equals and are a power of two, the calculation unit 31 may be configured to determine one or more candidate sets $\{\{h_1, \ldots, h_{N_{row}}\}^{(t)}, \pi^{(t)}\}$ by determining the candidate modulation mappings $\pi^{(t)}$ for $t=1, \ldots, T$ using binary representations of the values in the set of values GF(q). Examples of such embodiments comprise coded modulation schemes involving non-binary parity-check error correcting codes and modulation schemes 22 both of orders $q=2^m$, with m being a natural number higher than or equal to two (m≥2).

The following description of some embodiments will be made with reference to non-binary linear one parity-check codes, constructed over finite fields of orders $q=2^m$ and to q-QAM modulation schemes 22, for illustration purpose only. However, the skilled person will readily understand that the various embodiments apply to non-binary one parity-check codes constructed over any non-zero commutative division ring and to any q-ary modulation scheme 22 such as q-FSK modulations and hexagonal modulations. Exemplary non-binary linear error correcting codes comprise non-binary LDPC codes, non-binary convolutional codes, and non-binary Turbo codes.

According to some embodiments, the modulation scheme 22 may be a rectangular q-QAM modulation such as an 8-QAM modulation.

According to other embodiments, the modulation scheme 22 may be a square q-QAM modulation, such as 16-QAM and 64-QAM modulations.

For q-QAM modulations, the set of symbols $\mathcal{S}$ comprises q symbols. The corresponding signal constellation is a subset of the integer field $\mathbb{Z}[i]$, comprising q signal points. More specifically, for square modulations, the coordinates $s_j^I$ and $s_j^Q$ of a symbol $s_j \in \mathcal{S}$ take values in the interval $[-(\sqrt{q}-1), (\sqrt{q}-1)]$.

Each value from the set of values GF(q) is associated with a symbol from the set of symbols $\mathcal{S}$ and is represented by a signal point in the signal constellation.

Using non-binary error correcting codes, the calculation unit 31 may be configured to associate a binary vector of length m with each value in the set of values GF(q). Accordingly, a vector in the form $c_i = (c_i^0, c_i^1, \ldots, c_i^{m-1})_2$ comprising m bits may be associated with each element $c_i \in GF(q)$.

According to some embodiments, the calculation unit 31 may be further configured to determine at least one candidate modulation mapping (hereinafter referred to as 'initial candidate modulation mapping'), denoted by $\pi^{(0)}$, using the binary vectors associated with the values comprised in the set of values GF(q) such that it associates a symbol from the set of symbols $\mathcal{S}$ with the binary vector associated with each value in the set of values GF(q) defined by:

$$\pi^{(0)}: GF(q) \to \mathbb{R}^2$$
$$c_j = (c_j^0, c_j^1, \ldots, c_j^{m-1})_2 \mapsto \pi^{(0)}(c_j) \quad (14)$$

According to some embodiments, the initial candidate modulation mapping $\pi^{(0)}$ may be a Gray mapping, providing a signal constellation in which the binary vectors associated with each adjacent signal points differ in only one bit.

According to some embodiments, the calculation unit 31 may be configured to determine the candidate modulation mappings $\pi^{(t)}$ for $t=1, \ldots, T$ using vector permutation operations.

Accordingly, the calculation unit 31 may be configured to determine T vector permutation operations denoted by $\sigma_t$ for $t=1, \ldots, T$. A vector permutation $\sigma_t$ operates on the binary vectors associated with the values in GF(q) for permuting at least some of the bits comprised therein such that:

$$\sigma_t \cdot c_i = (c_i^0, \ldots, c_i^{m-1})_2 \mapsto \sigma_t(c_i) = (\sigma_t(c_i^0), \ldots, \sigma_t(c_i^{m-1}))_2 \quad (15)$$

A permutation operation $\sigma_t$ provides a permuted binary vector $\sigma_t(c_i) = (\sigma_t(c_i^0), \ldots, \sigma_t(c_i^{m-1}))_2$ in association with each value $c_i \in GF(q)$.

Given the determined permutation operations, the calculation unit 31 may be configured to determine the candidate modulation mappings $\pi^{(t)}$ for $t=1, \ldots, T$ by applying the initial candidate modulation mapping $\pi^{(0)}$ to map the permuted binary vectors associated with the values in the set of values, such that $\pi^{(t)}(c_i) = \pi^{(0)}(\sigma_t(c_i))$.

Determining the candidate modulation mappings $\pi^{(t)}$ using permutations of the binary representations associated with the values in the set GF(q) enables improving the Euclidean distance associated with the pairs of codeword vectors. As a result, the distance spectrum associated with the obtained coded modulation schemes can be improved.

Figure 5:
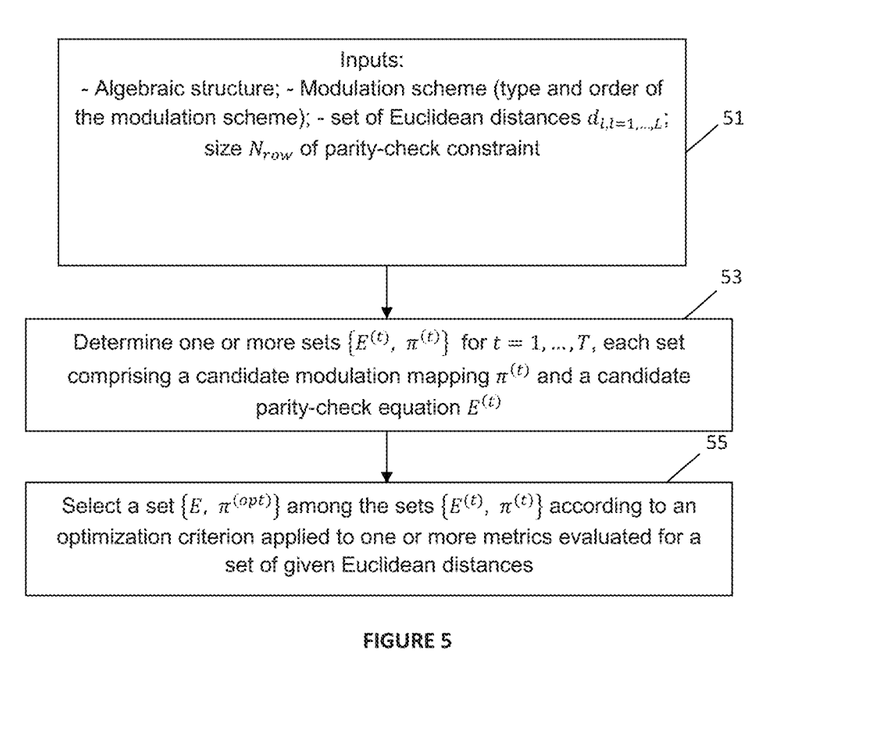
FIG. 5 is a flowchart depicting a method of determining a coded modulation scheme, according to some embodiments.

FIG. 5 is a flowchart depicting a method of determining a coded modulation scheme $\{\mathcal{C}_{opt}(F, E), \pi_{opt}\}$ by a joint optimization of the coefficients of the parity-check equation of a non-binary one parity-check code and of modulation mappings, according to some embodiments.

Step 51 may be performed to receive input parameters comprising the algebraic structure F, the type and order of the modulation scheme, a set of Euclidean distances $d_{l,l=1,\ldots,L}$, and the size $N_{row}$ of the parity-check constraint representing the number of non-zero coefficients defining the parity-check equation E.

The following description will be made with reference to Galois fields of orders $q \geq 2$ defined by the finite set of values GF(q), for illustration purpose only. However, the skilled person will readily understand that any non-zero commutative division ring can be used.

According to some embodiments, the set of coefficients defining the parity-check equation may comprise one or more unknown coefficients.

The modulation scheme is represented by a set of symbols denoted by $\mathcal{S}$.

According to some embodiments, the modulation scheme may be one-dimensional such as PAM.

According to other embodiments, the modulation scheme may be two-dimensional such as FSK, PSK, and QAM modulations.

According to other embodiments, the modulation scheme may be multi-dimensional, of a dimension higher than or equal to three (3).

According to some embodiments, the modulation scheme may be a higher-order modulation, i.e. a modulation of an order higher than or equal to four (4).

According to some embodiments, the order of the modulation scheme may be equal to the order of the finite field over which the one parity-check code is constructed.

According to other embodiments, the order of the modulation scheme may be different from the order of the finite field GF.

The determination of the coded modulation scheme $\{\mathcal{C}_{opt}(k, n, F, E), \pi_{opt}\}$ is based on a joint optimization of the coefficients of the parity-check equation and the modulation mapping used to map codeword vectors onto signal points according to the used modulation scheme.

Given the input parameters, step 53 may be performed to determine one or more candidate sets $\{E^{(t)}, \pi^{(t)}\} = \{\{h_1, \ldots, h_{N_{row}}\}^{(t)}, \pi^{(t)}\}$ for $t=1, \ldots, T$.

According to some embodiments, the determination of each set $\{\{h_1, \ldots, h_{N_{row}}\}^{(t)}, \pi^{(t)}\}$ may be performed at two steps.

At a first step, T possible candidate modulation mappings $\pi^{(t)}$ may be determined. A candidate modulation mapping $\pi^{(t)}$ associates each value in the set of values GF(q) with a symbol in the set of symbols $\mathcal{S}$.

According to some embodiments, the number T of the possible candidate modulation mappings may depend on the order of the used modulation scheme, i.e. on the number of the symbols in the set of symbols $\mathcal{S}$.

According to some embodiments, the candidate modulation mappings $\pi^{(t)}$ may be determined from a predefined set of modulation mappings. Exemplary modulation mappings comprise Gray mappings and natural mappings.

At a second step, a candidate set of coefficients $\{h_1, \ldots, h_{N_{row}}\}^{(t)}$ defining the parity-check equation $E^{(t)}$ may be determined for each mapping $\pi^{(t)}$.

According to some embodiments, the candidate set of coefficients $\{h_1, \ldots, h_{N_{row}}\}^{(t)}$ may be determined by performing an exhaustive search over at least a part of the set of values GF(q) in a way that the selected values improve the distance spectrum evaluated for at least one Euclidean distance in the set of Euclidean distances $d_{l,l=1,\ldots,L}$.

Each candidate set $\{\{h_1, \ldots, h_{N_{row}}\}^{(t)}, \pi^{(t)}\}$ for $t=1, \ldots, T$ provides a parity-check code $\mathcal{C}^{(t)}(GF, E^{(t)})$ and a number of codeword vectors that belong to the codebook $C^{(t)}$.

Using the determined candidate modulation mapping $\pi^{(t)}$, for $t=1, \ldots, T$, each pair of different codeword vectors $c^{(t)} \neq v^{(t)}$ in the codebook $C^{(t)}$ may be associated with an Euclidean distance $D_{c^{(t)},\pi^{(t)}}(c^{(t)}, v^{(t)})$ of a square value given according to equation (6).

Each candidate set $\{E^{(t)}, \pi^{(t)}\}$ may be associated with one or more metrics $S_{\mathcal{C}^{(t)},\pi^{(t)}}(d_l)$ evaluated for the Euclidean distances $d_{l,l=1,\ldots,L}$ according to equation (7).

Step 55 may be performed to select a set denoted by $\{E, \pi^{(opt)}\}$ from the determined one or more candidate sets $\{E^{(t)}, \pi^{(t)}\}$ for $t=1, \ldots, T$ according to an optimization criterion applied to one or more metrics $S_{\mathcal{C}^{(t)},\pi^{(t)}}(d_l)$.

According to some embodiments, step 55 may be performed to select, among the one or more candidate sets $\{E^{(t)}, \pi^{(t)}\}$ for $t=1, \ldots, T$, the candidate set associated with the smallest metric $S_{\mathcal{C}^{(t)},\pi^{(t)}}(d_l)$ evaluated for at least one Euclidean distance $d_l$, according to equation (9).

According to some embodiments, the number L and/or the values of the Euclidean distances in the set of Euclidean distances $d_{l,l=1,\ldots,L}$ may have been previously determined depending on the decoding error performance and the signal-to-noise ratio range.

Figure 6:
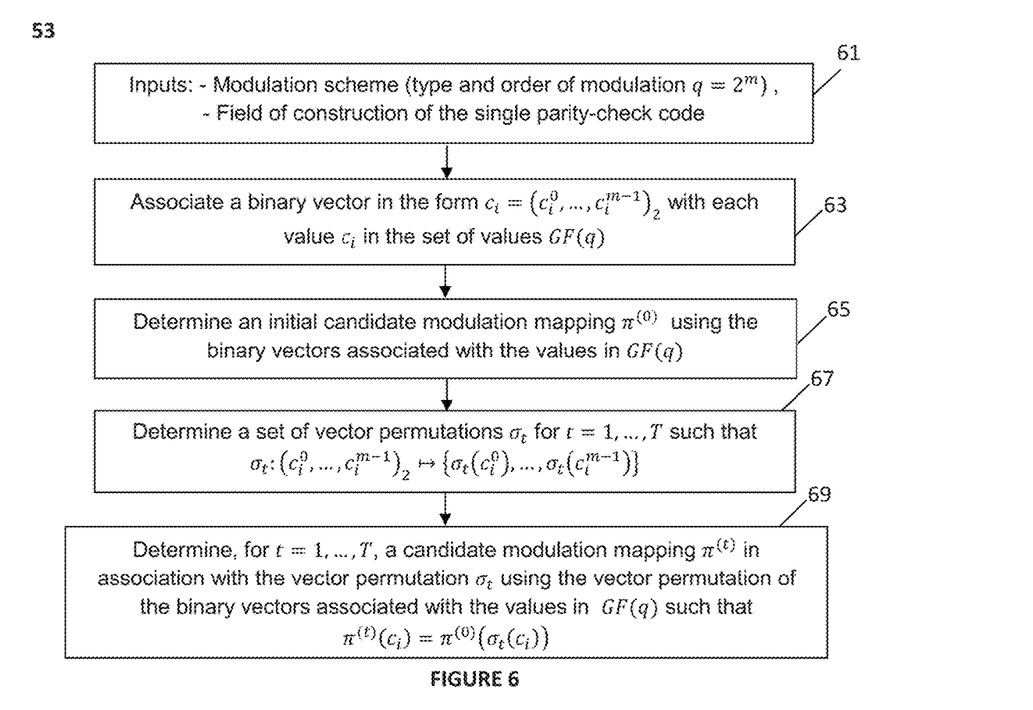
FIG. 6 is a flowchart depicting a method of determining a set of candidate modulation mappings, according to some embodiments in which q-QAM modulations are used, with q being a power of two numbers.

FIG. 6 is a flowchart depicting a method of determining one or more candidate modulation mappings $\pi^{(t)}$, according to some embodiments in which Galois fields of a power of two orders $q=2^m$, $m \geq 2$ and q-QAM modulation schemes are considered.

In embodiments of this type, the determination of one or more candidate modulation mappings may be performed based on binary representations of the values in the set of values GF(q)

Step 61 may be performed to receive input parameters. The input parameters may comprise the type and order of the modulation scheme and the field of construction of the one parity-check code. The following description will be made with reference to q-QAM modulations and to Galois fields of an order equal to the order of the QAM modulation with q=2m modulations and to Galois fields of an order equal to the order of the QAM modulation with q=2m.

At step 63, a binary vector in the form $c_i = (c_i^0, \ldots, c_i^{m-1})_2$ may be associated with each value $c_i \in GF(q)$.

Step 65 may be performed to determine an initial candidate mapping $\pi^{(0)}$ using the binary vectors associated with the values comprised in the set of values GF(q) such that it associates a symbol from the set of symbols $\mathcal{S}$ with the binary vectors associated with each value in the set of values (q), according to equation (14).

At step 67, a set of T vector permutations $\sigma_t$ for $t=1, \ldots, T$ may be determined. A vector permutation $\sigma_t$ operates for permuting at least some of the bits comprised in the binary vectors associated with the values in GF(q) such that $\sigma_t: c_i = (c_i^0, \ldots, c_i^{m-1})_2 \mapsto \sigma_t(c_i) = (\sigma_t(c_i^0), \ldots, \sigma_t(c_i^{m-1}))_2$.

At step 69, a candidate modulation mapping $\pi^{(t)}$, for $t=1, \ldots, T$, may be determined using the initial mapping $\pi^{(0)}$ and the permuted binary vectors associated with each value in the set of values GF(q), such that $\pi^{(t)}(c_i) = \pi^{(0)}(\sigma_t(c_i))$.

An evaluation of the decoding error probability coded modulation schemes constructed according to some embodiments has been performed by the inventors. 64-QAM modulations, non-binary one parity-check LDPC codes over GF(64), and three candidate modulation mappings $\pi^{(1)}$, $\pi^{(2)}$ and $\pi^{(3)}$ determined using binary representations of values in GF(64) have been considered.

Figure 7:
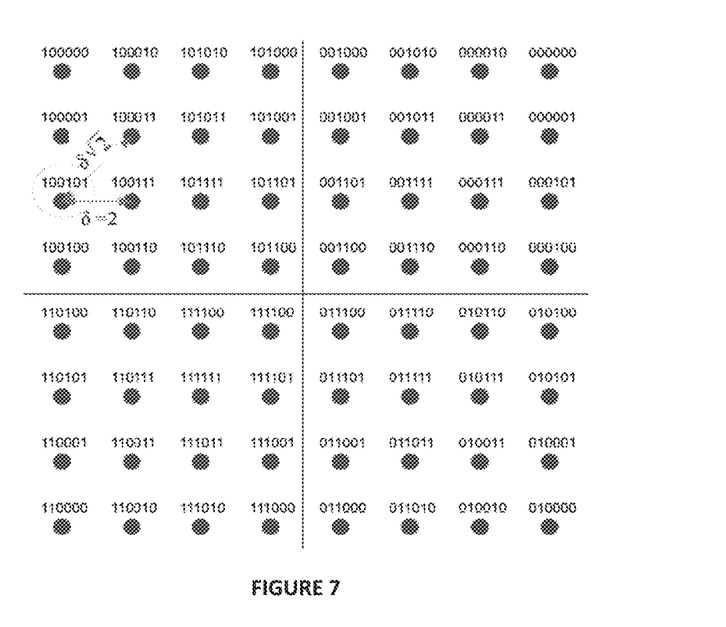
FIG. 7 is a diagram illustrating a candidate modulation mapping, according to one embodiment.
Figure 8:
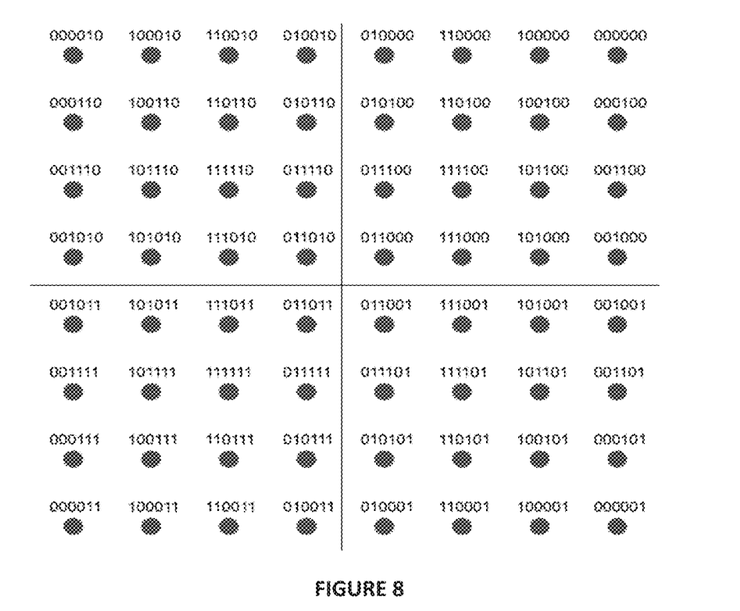
FIG. 8 is a diagram illustrating a candidate modulation mapping, according to another embodiment.
Figure 9:
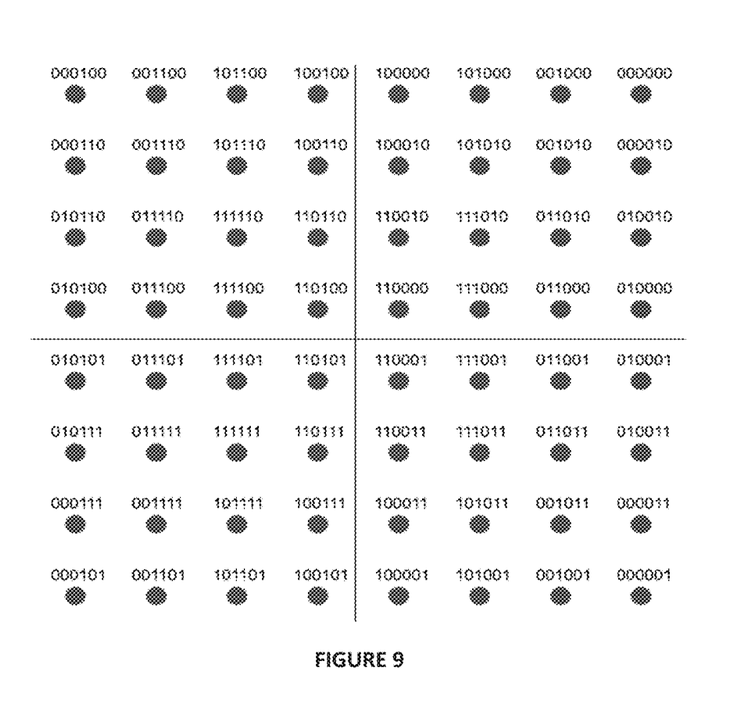
FIG. 9 is a diagram illustrating a candidate modulation mapping, according to another embodiment.

FIGS. 7, 8, and 9 are diagrams depicting the signal constellations for 64-QAM modulations obtained using respectively candidate modulation mappings $\pi^{(1)}$, $\pi^{(2)}$ and $\pi^{(3)}$.

The candidate modulation mapping $\pi^{(1)}$ is a Gray mapping and corresponds to the Gray mapping used in the DVB-T2 standard. The candidate modulation mappings $\pi^{(2)}$ and $\pi^{(3)}$ can be obtained from the candidate modulation mapping $\pi^{(1)}$, using the vector permutations $\sigma_2$ and $\sigma_3$, defined by:

$$\sigma_2: c_i = (c_i^5, c_i^4, c_i^3, c_i^2, c_i^1, c_i^0)_2 \mapsto \sigma_2(c_i) = (c_i^3, c_i^0, c_i^2, c_i^1, c_i^5, c_i^4)_2 \quad (16)$$

$$\sigma_3: c_i = (c_i^5, c_i^4, c_i^3, c_i^2, c_i^1, c_i^0)_2 \mapsto \sigma_2(c_i) = (c_i^4, c_i^2, c_i^1, c_i^0, c_i^5, c_i^3)_2 \quad (17)$$

Moreover, the non-binary one parity-check LDPC code is assumed regular with a number of non-zero coefficients in the parity-check equation given by $N_{row}=4$.

The optimization of the values of the four non-zero coefficients in the set of coefficients defining the parity-check equation as well as the selection of the optimal coded modulation scheme are based on the evaluation of two metrics considering the Euclidean distances $d_1=2\sqrt{3}$ and $d_2=4$. These two Euclidean distances correspond to the dominating terms in the upper bound of the error probability that determine the performance of the coded modulation scheme at the high signal-to-noise ratio regime, i.e. asymptotically.

Figure 10:
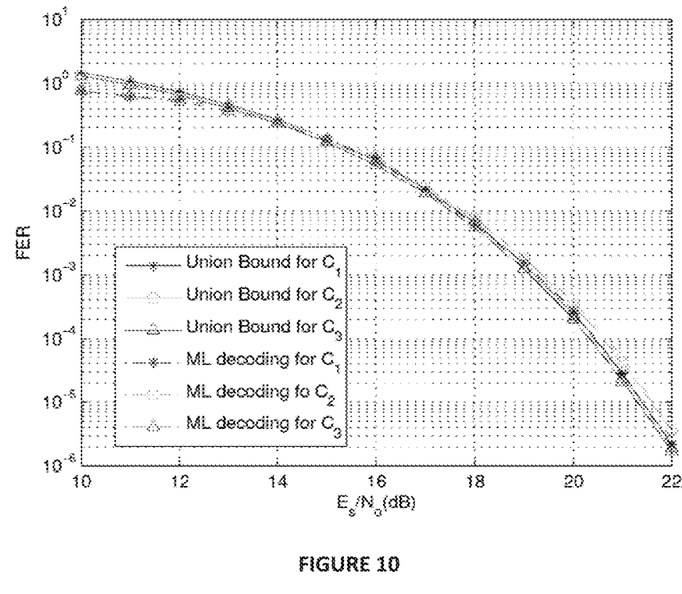
FIG. 10 is a diagram illustrating the Frame Error Rate obtained using coded modulations in a Gaussian transmission channel, according to some embodiments in which an LDPC code over GF(64) of a coding rate 1/2 is used, with a 64-QAM modulation.

The codeword vectors satisfying the parity-check equation can be in the configuration of the one parity-check code used in association with the results of FIG. 10 and it can be reduced to vectors comprising four components from GF(64). Each component is mapped to a symbol from the 64-QAM modulation. Accordingly, each codeword vector is mapped to a vector comprising four 64-QAM symbols. Considering erroneous decoding, a decoding error may occur if at least two symbols from the vector of symbols corresponding to the mapping of the transmitted codeword are erroneous. It is shown by the inventors that this decoding error configuration correspond to a distance between the transmitted and the decoded codeword vectors equal to $d_1=2\sqrt{3}$. This distance corresponds therefore to the first minimum Euclidean distance that can be considered for the evaluation of the distance spectrum.

First, for each candidate modulation mapping $\pi^{(1)}$, $\pi^{(2)}$ and $\pi^{(3)}$, the optimal values of the four non-zero coefficients in the set of coefficients defining the parity-check equation have been determined by performing an exhaustive search over GF(64)in a way that they minimize the distance spectrum evaluated considering the Euclidean distances $d_1=2\sqrt{3}$ and $d_2=4$. Using a notation of each non-zero value in GF(64)in the form $\alpha^\mu$, $\mu=0, \ldots, 62$, the optimal values of the four non-zero coefficients associated with the modulations mappings $\pi^{(1)}$, $\pi^{(2)}$ and $\pi^{(3)}$ are respectively given by $\{\alpha^0, \alpha^9, \alpha^{22}, \alpha^{37}\}^{(1)}$, $\{\alpha^0, \alpha^9, \alpha^{22}, \alpha^{37}\}^{(2)}$, and $\{\alpha^0, \alpha^8, \alpha^{16}, \alpha^{42}\}^{(3)}$. The obtained values provide the three following sets:

$$\{\{\alpha^0, \alpha^9, \alpha^{22}, \alpha^{37}\}^{(1)}, \pi^{(1)}\}, \{\{\alpha^0, \alpha^9, \alpha^{22}, \alpha^{37}\}^{(2)}, \pi^{(2)}\}, \{\{\alpha^0, \alpha^8, \alpha^{16}, \alpha^{42}\}^{(3)}, \pi^{(3)}\} \quad (18)$$

The three sets provide respectively the couples $\{\mathcal{C}^{(1)}, \pi^{(1)}\}$, $\{\mathcal{C}^{(2)}, \pi^{(2)}\}$ and $\{\mathcal{C}^{(3)}, \pi^{(3)}\}$ and they are associated each with two metrics $S_{\mathcal{C}^{(t)}, \pi^{(t)}}(d_1)$ and $S_{\mathcal{C}^{(t)}, \pi^{(t)}}(d_2)$ for t=1, 2, 3 evaluated for two Euclidean distance $d_1$ and $d_2$. The metrics are defined by:

$$S_{\mathcal{C}^{(1)}, \pi^{(1)}}(d_1)=516096; \quad S_{\mathcal{C}^{(1)}, \pi^{(1)}}(d_2)=386672 \quad (19)$$

$$S_{\mathcal{C}^{(2)}, \pi^{(2)}}(d_1)=909312; \quad S_{\mathcal{C}^{(2)}, \pi^{(2)}}(d_2)=2910208 \quad (20)$$

$$S_{\mathcal{C}^{(3)}, \pi^{(3)}}(d_1)=385024; \quad S_{\mathcal{C}^{(3)}, \pi^{(3)}}(d_2)=3499008 \quad (21)$$

The selection of the set providing the optimal coded modulation scheme among the determined three sets is performed according to the values of the metrics given in equations (20)-(22). As the couple $\{\mathcal{C}^{(3)}, \pi^{(3)}\}$ is associated with the smallest value of the metric $S_{\mathcal{C}^{(3)}, \pi^{(3)}}(d_1)$, the set $\{\{\alpha^0, \alpha^8, \alpha^{16}, \alpha^{42}\}^{(3)}, \pi^{(3)}\}$ may be selected.

Figure 11:
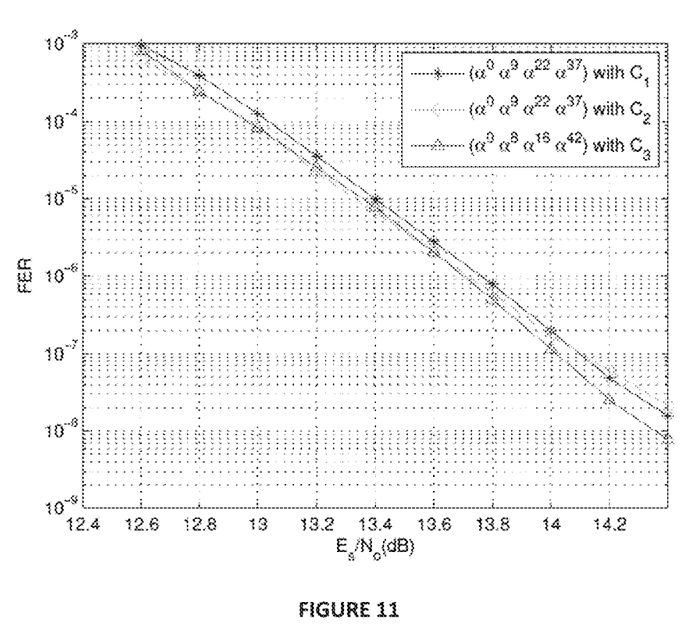
FIG. 11 is a diagram illustrating the Frame Error Rate obtained, using coded modulations in a Gaussian transmission channel, according to some embodiments in which a regular LDPC code of a coding rate 1/2 is used with a 64-QAM modulation.

FIG. 10 depicts the Frame Error Rate (FER) performance as a function of the signal to noise ratio obtained in a Gaussian transmission channel, using the three sets in equation (18) with regular one parity-check non-binary code over GF(64). The union bound approximation evaluated theoretically in inequality (13) as well as the error probability obtained under ML decoding using Monte-Carlo simulations with a stopping criterion of 1000 errors are analyzed for each set. FIG. 11 demonstrates that the derived union bound approximation is accurate for signal-to-noise values greater than or equal to 16 dB and becomes an exact bound in the high signal-to-noise ratio regime starting from 20 dB. Numerical results show also the outperformance of the selected couple $\{\mathcal{C}^{(3)}, \pi^{(3)}\}$.

FIG. 11 depicts the FER performance as a function of the signal to noise ratio obtained using the three sets of equation (19) by considering a regular non-binary LDPC code constructed over GF(64)with 48 components per each codeword vector, 2 non-zero coefficients in each column of the parity-check matrix and $N_{rows}=4$ and under ML decoding using the iterative EMS algorithm. In particular, the L-Bubble EMS algorithm, a variation of the EMS algorithm, with twenty (20) decoding iterations has been used. Plotted results show that the selected couple $\{\mathcal{C}^{(3)}, \pi^{(3)}\}$ provides better performances that the couples $\{\mathcal{C}^{(1)}, \pi^{(1)}\}$ and $\{\mathcal{C}^{(2)}, \pi^{(2)}\}$. It should be noted that the performance gain obtained advantageously does not entail any additional computational complexity at the transmitter 11 nor at the receiver 15.

The methods and devices described herein may be implemented by various means. For example, these techniques may be implemented in hardware, software, or a combination thereof. The processing elements of the coded modulation device 21 may be implemented for instance according to a hardware-only configuration (as an example, in one or more FPGA, ASIC or VLSI integrated circuits with the corresponding memory) or according to a configuration using both VLSI and DSP.

While embodiments of the invention have been illustrated by a description of various examples, and while these embodiments have been described in considerable detail, it is not the intent of the applicant to restrict or in any way limit the scope of the appended claims to such details. Additional advantages and modifications will readily appear to those skilled in the art. The invention in its broader aspects is therefore not limited to the specific details, representative methods, and illustrative examples shown and described.

Further, even if the invention has advantages in an application to communication systems, it should be noted that the invention is not limited to such communication devices and may be integrated in numerous devices such as data storage devices.

The methods described herein can be implemented by computer program instructions supplied to the processor of any type of computer, to produce a machine with a processor that executes the instructions to implement the functions/acts specified herein. These computer program instructions may also be stored in a computer-readable medium that can direct a computer to function in a particular manner. To that end, the computer program instructions may be loaded onto a computer to cause the performance of a series of operational steps and thereby produce a computer implemented process such that the executed instructions provide processes for implementing the functions specified herein.

The invention claimed is:

1. A device for determining a coded modulation scheme, said coded modulation scheme being defined by at least one non-binary error correcting code containing at least one non-binary parity-check equation, a modulation scheme, and a modulation mapping, wherein said device comprises:
   a calculation unit configured to determine two or more candidate modulation mappings and two or more candidate parity-check equations defining said at least one non-binary error correcting code, a candidate set comprising a candidate modulation mapping and at least one candidate parity-check equation providing codeword vectors and being associated with one or more metrics, each metric being evaluated for a number of distinct pairs of codeword vectors having an Euclidean distance of a defined value;
   a selection unit configured to select one candidate modulation mapping and at least one candidate parity-check equation according to an optimization criterion applied to said one or more metrics; and
   a transmitter for transmitting data applied with said selected candidate modulation mapping and said selected candidate parity-check equation to a receiver.

2. The device of claim 1, wherein each candidate parity-check equation is represented by one or more coefficients, the error correcting code being defined by a set of values, the calculation unit being configured to determine each candidate parity-check equation by determining a value of at least one coefficient representing each candidate parity-check equation from said set of values.

3. The device of claim 1, wherein the calculation unit is configured to determine said two or more candidate modulation mappings from a predefined set of modulation mappings.

4. The device of claim 1, wherein the optimization criterion comprises the minimization of at least one metric from said one or more metrics.

5. The device of claim 1, wherein said modulation scheme is selected in a group consisting of a phase-shift keying modulation, a frequency-shift modulation, and a quadrature amplitude modulation.

6. The device of claim 2, wherein said set of values comprises a number of values, said number of values being a power of two.

7. The device of claim 6, wherein said modulation scheme is represented by a set of symbols, the calculation unit being further configured to associate a binary vector with each value of said set of values and to determine at least one candidate modulation mapping using the binary vectors associated with at least some values of said set of values, the candidate modulation mapping associating a symbol from the set of symbols with each binary vector.

8. The device of claim 7, wherein each binary vector comprises a plurality of bits, the calculation unit being configured to determine one or more vector permutations, each vector permutation being applied to permute at least some of the bits comprised in the binary vector associated with each value of said set of values, thereby providing a permuted binary vector in association with each value, the calculation unit being configured to determine the one or more candidate modulation mappings by applying the at least one candidate modulation mapping to the permuted binary vectors.

9. The device of claim 3, wherein said predefined set of modulation mappings comprises modulation mappings selected in a group consisting of Gray mappings and natural mappings.

10. A transmitter configured to transmit a data sequence over a transmission channel to a receiver in a transmission system, said data sequence being encoded and modulated by a coded modulation scheme, said coded modulation scheme being defined by at least one non-binary error correcting code containing at least one non-binary parity-check equation, a modulation scheme, and a modulation mapping, and being determined as an output of:
   a calculation unit configured to determine two or more candidate modulation mappings and two or more candidate parity-check equations defining said at least one non-binary error correcting code, a candidate set comprising a candidate modulation mapping and at least one candidate parity-check equation providing codeword vectors and being associated with one or more metrics, each metric being evaluated for a number of distinct pairs of codeword vectors having an Euclidean distance of a defined value; and
   a selection unit configured to select one candidate modulation mapping and at least one candidate parity-check equation according to an optimization criterion applied to said one or more metrics.

11. The transmitter of claim 10, wherein the transmission channel is associated with a transmission power, the transmitter being configured to determine the modulation scheme depending on the transmission power.

12. The receiver configured to receive and decode the data sequence transmitted by the transmitter according to claim 10.

13. A method for transmitting data and determining a coded modulation scheme, said coded modulation scheme being defined by at least one non-binary error correcting code containing at least one non-binary parity-check equation, a modulation scheme, and a modulation mapping, wherein said method comprises:
   determining two or more candidate modulation mappings and two or more candidate parity-check equations defining said at least one non-binary error correcting code, a candidate set of a candidate modulation mapping and at least one candidate parity-check equation providing codeword vectors and being associated with one or more metrics, each metric being evaluated for a number of distinct pairs of codeword vectors having an Euclidean distance of a defined value;
   selecting one candidate modulation mapping and at least one candidate parity-check equation, according to an optimization criterion applied to said one or more metrics; and
   transmitting, by a transmitter, the data applied with said selected candidate modulation mapping and said selected candidate parity-check equation to a receiver.

* * * * *